United States Patent [19]

Nuyen

[11] 4,450,462
[45] May 22, 1984

[54] GAAS FIELD EFFECT TRANSISTOR WITH A NON-VOLATILE MEMORY

[75] Inventor: Trong L. Nuyen, Paris, France

[73] Assignee: Thomson-CSF, Paris, France

[21] Appl. No.: 294,382

[22] Filed: Aug. 19, 1981

[30] Foreign Application Priority Data

Aug. 20, 1980 [FR] France .................................. 80 18186

[51] Int. Cl.³ .................. H01L 29/78; H01L 29/161; H01L 27/12
[52] U.S. Cl. ......................................... 357/23; 357/4; 357/16; 357/58; 357/61
[58] Field of Search ................ 357/23 NS, 16, 58, 61, 357/4, 23 VT; 365/184

[56] References Cited

U.S. PATENT DOCUMENTS

| | | | |
|---|---|---|---|
| 4,075,652 | 2/1978 | Umebachi et al. | 357/16 |
| 4,111,725 | 9/1978 | Cho et al. | 357/61 X |
| 4,160,261 | 7/1979 | Casey, Jr. et al. | 357/230 R |
| 4,320,410 | 3/1982 | Nishizawa et al. | 357/23 X |

OTHER PUBLICATIONS

T. Kawakami et al., "n-Channel Formation on Semi--Insulating InP Surface by M.I.S.F.E.T.", *Electronics Letters*, vol. 16, (1979), p. 743.

H. Morkoc et al., "Normally-Off Al$_{0.5}$Ga$_{0.5}$As Heterojunction-Gate GaAs F.E.T.", *Electronics Letters*, vol. 13, (1977), pp. 747–748.

*Primary Examiner*—Martin H. Edlow
*Assistant Examiner*—J. Carroll

[57] ABSTRACT

The invention relates to field effect transistors having a non-volatile memory effect of the MIS type. According to the invention the transistor comprises, in addition to substrate (17), a source (21), a drain (22), a grid formed by a semi-insulating film (18) and an insulating layer (19), whose semi-insulating film (18) has a thickness below 100 angströms and is formed from a semiconductive material of groups III–V having a broader forbidden band than that of the active layer (16) on which it is deposited. Useful applications of the invention include ultra-high frequency transistors for telecommunications.

9 Claims, 11 Drawing Figures

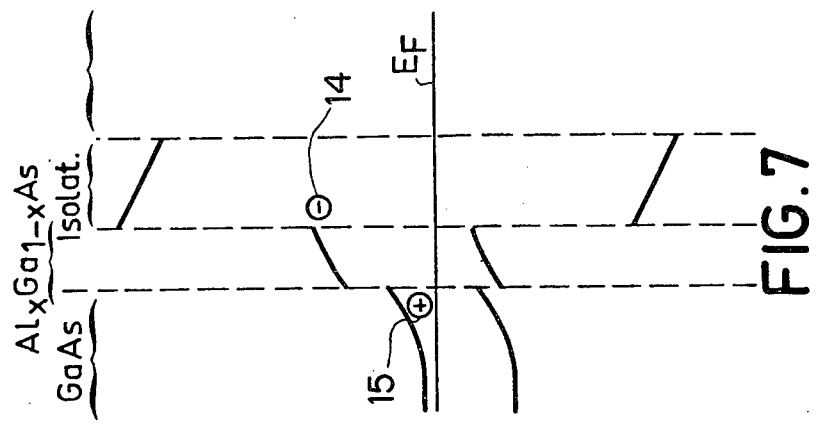
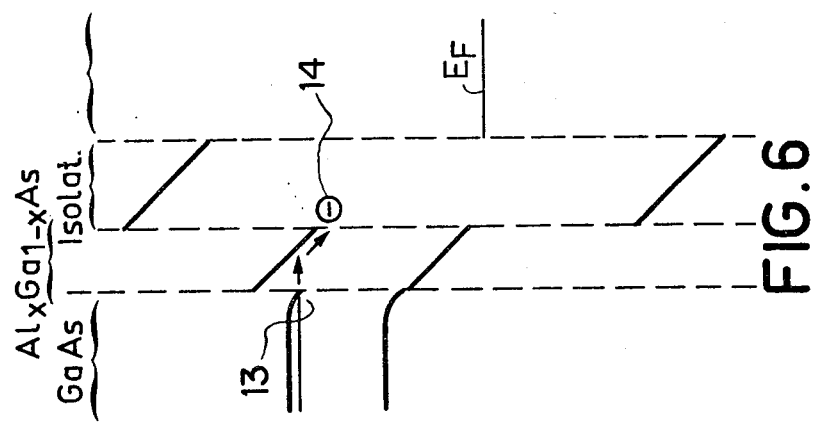
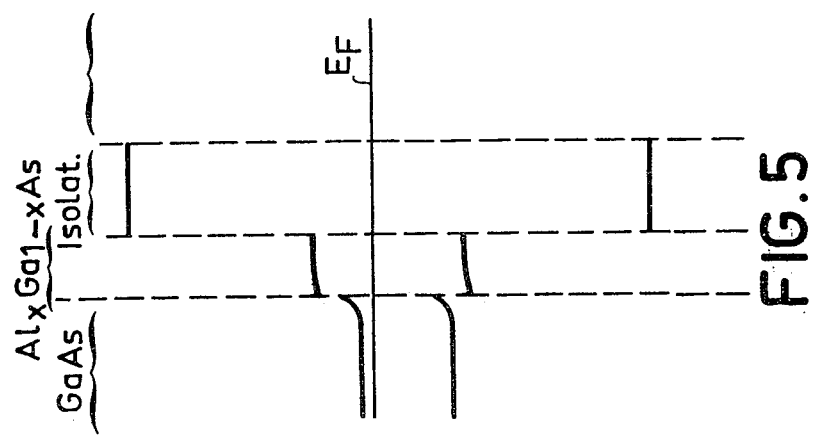

GAAS FIELD EFFECT TRANSISTOR WITH A NON-VOLATILE MEMORY

BACKGROUND OF THE INVENTION

The present invention relates to field effect transistors having a non-volatile memory effect of the metal-insulant-semiconductor (MIS) type in which the semiconductor is a compound of group III-V and the insulant a double dielectric layer.

MIS transistors on silicon are well known. In the case of silicon several types of insulants are known, whose quality refers to the following different criteria:

low density of defects called interface states between the insulant and the semiconductor,
low density of electrical charges in the insulant,
good voltage response.

According to these criteria MIS on silicon and particularly MOS, i.e. MIS in which the insulant is an oxide are of excellent quality. Thus, silicon MOS with $SiO_2$ as the insulant are very frequently used, as are MNOS, which has a more complex structure: metal-silicon nitride ($Si_3N_4$)-oxide $SiO_2$-semiconductor.

The silicon MOS operates with a charge reversal operating mode, i.e. the metal grid is polarized in such a way that a charge of the opposite type to that of the semiconductor is formed at the insulant-semiconductor interface. For example if the semiconductor is of the p type, the grid is positively polarized and a negative charge constituted by electrons forms in the semiconductor at the interface with the insulant. This charge constitutes the N-type channel of the field effect transistor.

In MNOS transistors the creation of charges in the transistor channel may involve various more complex phenomena permitting their use in logic circuits with a non-volatile memory. These phenomena can be briefly described as follows, using as an example an N-channel transistor.

In the case of low positive grid polarizations the MNOS transistor functions in accordance with the same principle as the MOS transistor described. For higher positive grid polarizations electrons can traverse the $SiO_2$ oxide layer by a tunnel effect if the layer has a limited thickness. The electrons pass through the oxide in the semiconductor-oxide direction and are fixed at the oxide-nitride interface due to the existence of traps at this point. When the polarization breaks down the electrons trapped at the oxide-nitride interface induce a positive charge in the semiconductor close to the interface with the oxide. Due to this positive charge it is necessary for the purpose of forming a negative charge channel to polarize the grid more strongly than was necessary prior to the trapping of the electrons at the oxide-nitride interface. Thus, there is a non-volatile memory effect of the high polarization creating the tunnel effect.

However, despite these very interesting possibilities MOS and MNOS transistors on silicon have very limited performance levels. These limitations are due to the limited mobility of electrons in silicon compared with the mobility in GaAs or other compounds of the III-V group.

Field effect transistors on GaAs are essentially limited to Schottky grid transistors, called MESFET (metal Schottky field effect transistor). In logic circuits MESFET's with a normally open channel require complicated circuitry and consume a large amount of energy. However, MESFET's with a normally closed channel are extremely complicated from the construction standpoint. In all cases MESFET's cannot be used as a non-volatile memory in the same way as MNOS. The prior art GaAs MESFET's are often of poor quality because the GaAs-insulant interface has a high density of interface states.

French Patent Application Nos. 79 22 301 and 79 26 611 of the applicant company describe MISFET transistors having two insulant layers, one constituted by $Al_xGa_{1-x}As$ and the other by a broad forbidden band insulant such as $SiO_2$, $Si_3N_4$ or $Al_2O_3$. The use of $Al_xGa_{1-x}As$ as the first dielectric layer makes it possible to reduce the density of interface states. However, these MISFET's cannot be used as a non-volatile memory.

BRIEF SUMMARY OF THE INVENTION

The particular aim of the invention is to provide a transistor on GaAs having characteristics permitting its use as a non-volatile memory. This transistor has a double dielectric layer, the first GaAs layer being sufficiently thin to permit the transfer of electrons by the tunnel effect, as in the case of MNOS structures.

More specifically the present invention relates to a field effect transistor with a non-volatile memory effect comprising, supported by a semi-insulating substrate, two access regions called the source and drain and a control region constituted by an active layer and by a control grid, itself formed by a semi-insulating film an insulating layer and a contacting metal layer, wherein the semi-insulating film has a thickness below 100 angströms so as to permit the passage of electrons by the tunnel effect and wherein it is made from a material from the group of III-V semiconductors having a broader forbidden band than that of the material forming the active layer and having a structure and crystalline parameters close to those of the material of said active layer.

BRIEF DESCRIPTION OF THE DRAWINGS

The invention is described in greater detail hereinafter relative to non-limitative embodiments and the attached drawings, wherein show:

FIGS. 5, 6 and 7: diagrams of the bands of a metal-oxide-semi-insulating $Al_xGa_{1-x}As$-N-type GaAs structure:
  at equilibrium under zero polarization (FIG. 5),
  highly positive polarization (FIG. 6),
  return to zero polarization following the previous state (FIG. 7).

DETAILED DESCRIPTION OF THE PREFERRED EMBODIMENTS

Figure 1:
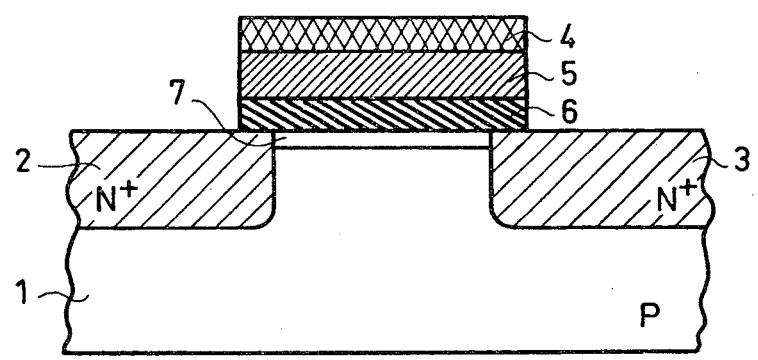
FIG. 1: a diagrammatic section of a silicon MNOS transistor.

FIG. 1 is a diagrammatic section through a silicon MNOS transistor. With an e.g. p-type substrate 1 are associated a source region 2 and a drain region 3, which are N+ doped, i.e. of opposite sign to that of the substrate. The grid is formed by the contacting metal 4, a silicon nitride ($Si_3N_4$) layer 5 and a silicon oxide ($SiO_2$) film 6, which are deposited on the substrate surface between the two source and drain regions.

As has been stated hereinbefore for a certain positive polarization value of the grid a positive charge channel 7 is produced beneath the grid. Therefore grid polarization modulation makes it possible to modulate the source-drain current by means of channel 7. In the case of high grid polarizations electrons pass through the insulating film 6 by a tunnel effect if the latter has a thickness of approximately 20 to 40 Å. After passing through film 6 the electrons are trapped at the interface between layers 5 and 6. When the grid polarization returns to a zero value, the trapped electrons induce a charge in the semiconductor which modifies the behaviour of channel 7 with respect to the subsequent grid polarization.

Figure 4:
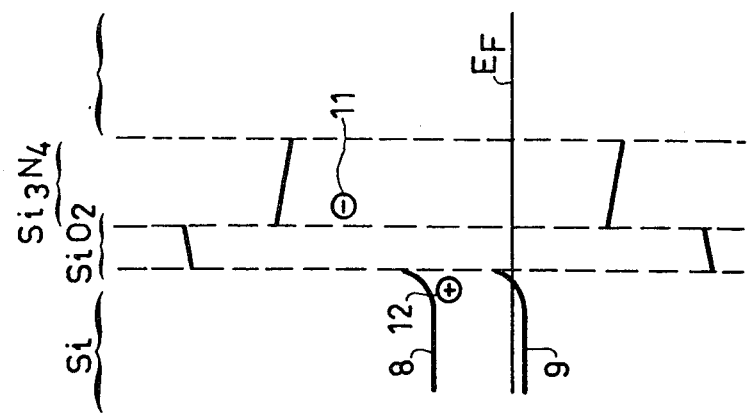
FIGS. 2, 3 and 4: diagrams of the bands of a silicon MNOS structure:
  at equilibrium under positive polarization (FIG. 2),
  under highly positive polarization (FIG. 3),
  on return to zero polarization following the above state (FIG. 4).
Figure 3:
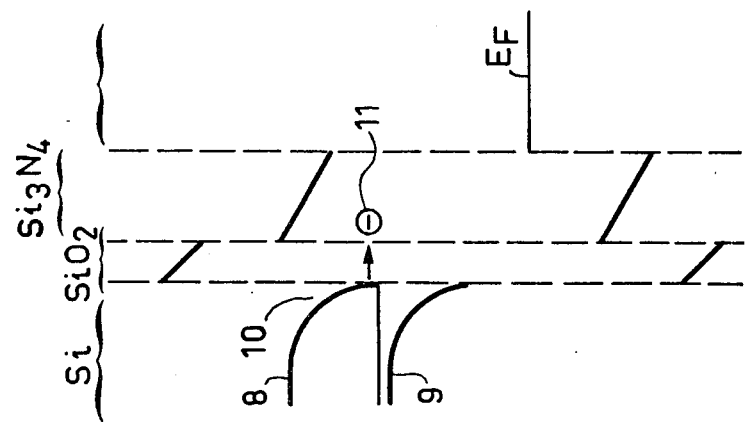
Figure 2:
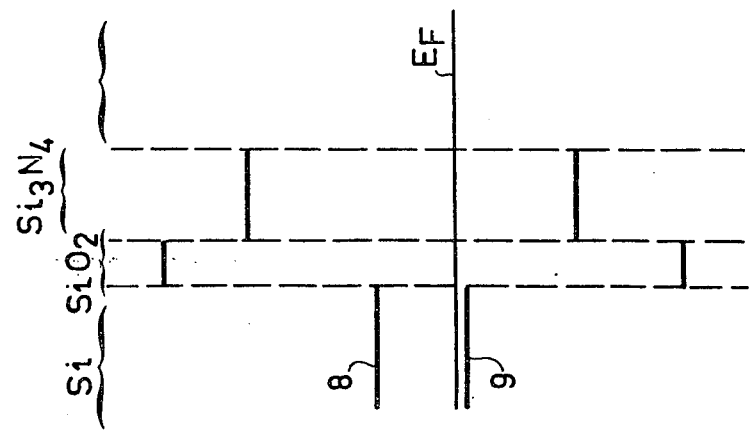

These electron transfer and charge induction phenomena are explained in FIGS. 2, 3 and 4 which show the diagrams of bands of an MNOS structure.

FIG. 2 corresponds to a zero grid polarization.

FIG. 3 corresponds to a positive polarization, the conduction band 8 and the valence band 9 of the silicon being curved so as to create a charge reversal zone 10. If this polarization is sufficiently high an electron 11 can pass through the $SiO_2$ film by a tunnel effect. FIG. 3 corresponds to a direct tunnel effect of the electrons contained in reversal layer 10 towards the interface traps between $SiO_2$ and $Si_3N_4$.

FIG. 4 shows the diagram of the bands of the MNOS structure on return to zero polarization following the state corresponding to FIG. 3. Electrons 11 induce a positive charge 12 in the semiconductor which did not exist in the initial state of FIG. 2.

FIGS. 5, 6 and 7 show the diagrams of bands of an MIS structure with a heterojunction constituted by an active N-type GaAs layer, a semi-insulating $0.2 \leq X \leq 1$ $Al_xGa_{1-x}As$ film of thickness below 100 Å, an insulating oxide layer and a grid metal coating. The charge depletion and accumulation operations take place in the GaAs layer. The mobility of the electrons in the GaAs is much higher than that in silicon, so that GaAs MIS are high-speed components operating at a very high frequency, provided that the charges in the GaAs and close to the interface with the insulant are not fixed by the interface states. The $Al_xGa_{1-x}As$ film serves as an insulant having with the GaAs an interface with only a few traps. This is proved by publications on the determination of the density of traps at the interface of the GaAs/$Al_xGa_{1-x}As$ heterojunction (D. V. LANG and R. A. LOGAN—Applied Physics Letters 31, no. 10, 683, 1977) and on the study of the transfer properties at this interface (R. DINGLE, H. L. STORMER, A. C. GOSSARD and W. WIEGMAN—Applied Physics Letters 33, no. 7, 665, 1978). This excellent interface quality is explained by the fact that GaAs and $Al_xGa_{1-x}As$ have the same crystalline structure and very similar crystalline parameters. From this standpoint the compounds $Ga_xIn_{1-x}P$, $Al_xIn_{1-x}P$, $AlP_xSb_{1-x}$, $Al_x$-$Ga_{1-x}P_ySb_{1-y}$, $Al_xGa_{1-x}As$, $Ga_xIn_{1-x}P_ySb_{1-y}$ are also suitable.

FIG. 5 shows the diagram of the bands of the heterojunction MIS structure in the absence of grid polarization.

FIG. 6 shows the structure of a heterojunction MIS in the case of positive polarization of the grid. There is an accumulation 13 of electrons in the GaAs layer. If the positive polarization is sufficiently high electrons from the accumulation zone 13 can traverse the $Al_x$-$Ga_{1-x}As$ film by a tunnel effect. If the latter is sufficiently thin (approximately 20 to 50 Å) the tunnel effect is direct. If not the tunnel effect is of the Fowler-Nordheim type, i.e. electron 14 firstly reaches the bottom of the $Al_xGa_{1-x}As$ conduction band before being fixed to a trap at the $Al_xGa_{1-x}As$ insulant interface. This mechanism is shown in FIG. 6.

FIG. 7 corresponds to the structure which has returned to zero polarization in which electron 14 induces a positive charge 15 in the GaAs semiconductor, thus causing an electron-free region at the interface with $Al_xGa_{1-x}As$. If the GaAs layer is sufficiently thin (below 1000 Å) it then becomes completely electron-free. Thus, one passes from FIG. 5 in which the GaAs layer is conductive to FIG. 7 in which it is not conductive. If the GaAs layer is thicker or if charge 15 is not sufficiently high for the said layer to be completely electron-free, the layer remains conductive, but its charge state differs from that prior to the high positive polarization shown in FIG. 6.

The heterojunction MIS structure described hereinbefore is not limited to an active GaAs layer. An active layer constituted by another semiconductor in the III-V group is also suitable, provided that it has a broad forbidden band with an adequate mesh parameter. Thus, for an active InP layer it is possible to use $AlAs_xSb_{1-x}$ or $AlP_xSb_{1-x}$, and for an active $Ga_x$-$In_{1-x}As$ film it is possible to use InP, $Al_xIn_{1-x}As$, $AlAs_xSb_{1-x}$, $AlP_xSb_{1-x}$.

Figure 8:
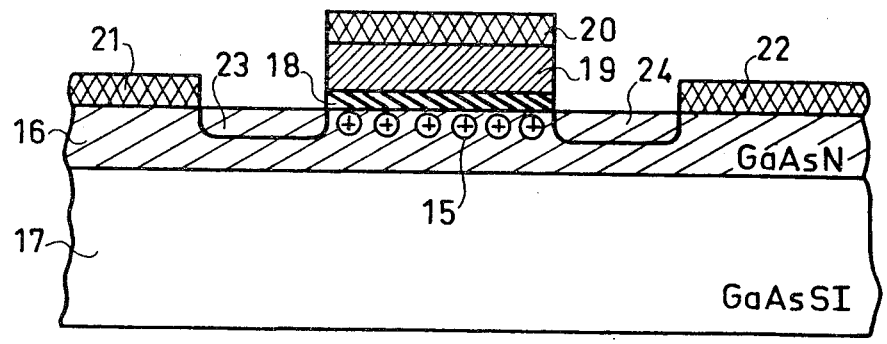
FIG. 8: a first type of non-volatile memory transistor according to the invention.

FIG. 8 shows a first example of a heterojunction MIS field effect transistor according to the invention, whose operating diagram has been described hereinbefore. The N-type GaAs active layer 16 is deposited on a semi-insulating GaAs substrate 17, i.e. with a high resistivity. The grid is formed by a succession of semi-insulating $Al_xGa_{1-x}As$ or $Ga_xIn_{1-x}P$, $Al_xIn_{1-x}P$ films 18 whose thickness is between about 10 and about a hundred angstroms, insulating layers 19 with a thickness of several hundred angstroms and grid metallization layers 20. An ohmic source contact 21 and an ohmic drain contact 22 complete the device. As two contacts 20, 21 are arranged with respect to the grid two electron-free zones 23, 24 are created at the GaAs surface. To ensure that the depth of these electron-free zones does not reach the interface between the active layer 16 and the semi-insulating substrate 17, the thickness of layer 16 is relatively high, i.e. approximately 1000 to 2000 Å for a doping of said layer 16 of approximately $5 \times 10^{16}$ to $10^{17}$ at.$cm^3$. Due to this thickness the device operates under charge depletion conditions. In other words the transistor is normally open, i.e. in the absence of grid polarization a current flows between the source and the drain. The grid must be negatively polarized to a value $V_1 < 0$ to grip or nip the channel and bring the transistor into the closed position. On successively applying a high positive voltage $V_3$ to the grid and then returning to zero, as described with reference to FIGS. 6 and 7, a positive charge 15 is created under the grid. As the thickness of layer 16 is adequate to ensure that charge 15 does not completely remove the electrons from the transistor channel, the latter remains conductive and the transistor remains normally open. However, for gripping or nipping the channel it is necessary to apply a negative voltage $V_2$ with $|V_2| < |V_1|$. Thus, there is a non-volatile memory effect.

Figure 9:
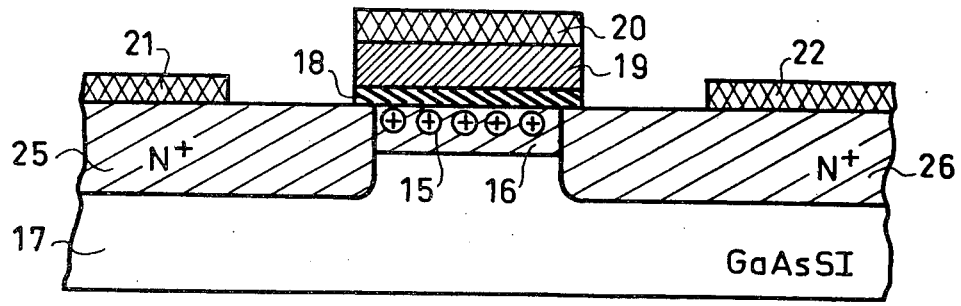
FIG. 9: a second type of a non-volatile memory transistor according to the invention.

FIG. 9 shows a second example of a heterojunction MIS field effect transistor. Like the first example shown in FIG. 8 it comprises a semi-insulating GaAs substrate 17, a type N GaAs active layer 16, a grid formed by a semi-insulating film 18, e.g. of $Al_xGa_{1-x}As$, an insulating layer 19 and metal coating 20. However, the two ohmic contacts 21, 22 are deposited on two cases or boxes 25, 26 of the N+ type, i.e. with a high doping exceeding $10^{18}$ at.cm$^3$. These two boxes are in contact with the grid and can even slightly penetrate below it in order to eliminate the two space charge zones 23, 24 in the structure of FIG. 8. The arrangement of these two N+ boxes 25, 26 consequently makes it possible to reduce the thickness of layer 16 to below 1000 Å for a doping of $5 \times 10^{16}$ to $10^{17}$ at.cm$^3$. This reduction makes it possible to have a conductive channel in the absence of any polarization of the grid and a non-conductive channel if a high grid voltage is applied, followed by a return to zero in the manner described in connection with FIGS. 6 and 7. In other words the transistor can be normally open or normally blocked, as a function of the electrical treatments previously undergone by the grid. This new possibility of a non-volatile memory is added to the effect on the grid control voltage difference $V_1$ and $V_2$ explained hereinbefore with $V_1 < 0$ and $V_2 > 0$. It is possible to use this transistor in a normally always blocked condition, i.e. $V_1$ and $V_2 > 0$, provided that the grid is highly polarized to two different values $V_3$ and $V'_3$.

Figure 10:
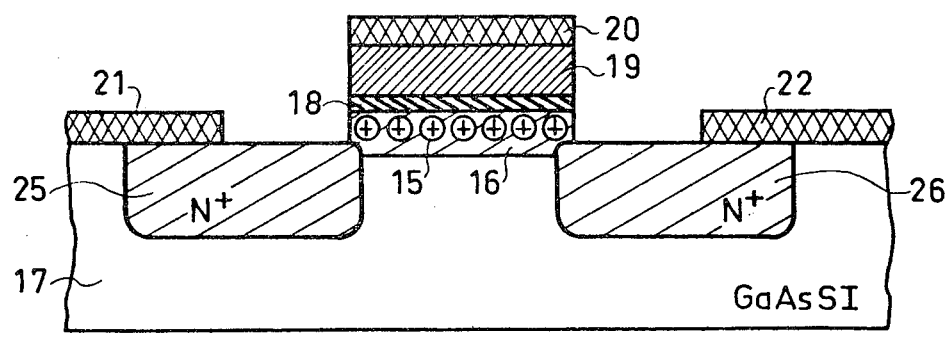
FIG. 10: a third type of non-volatile memory transistor according to the invention.

FIG. 10 shows the third example of a heterojunction MIS transistor according to the invention. It is in fact a variant of the transistor of FIG. 9. The difference relates to the position of the two N+ boxes 25 and 26 with respect to the GaAs layer 16 and the $Al_xGa_{1-x}As$ film 18. In FIG. 10 the two boxes 25 and 26 are in contact with layer 16, but are not in contact with film 18. This ensures that the electrons which have passed through film 18 by a tunnel effect cannot be partly drained by the source-drain voltage. The two boxes 25, 26 may just be in contact with layer 16 or may be partly positioned in the latter.

Figure 11:
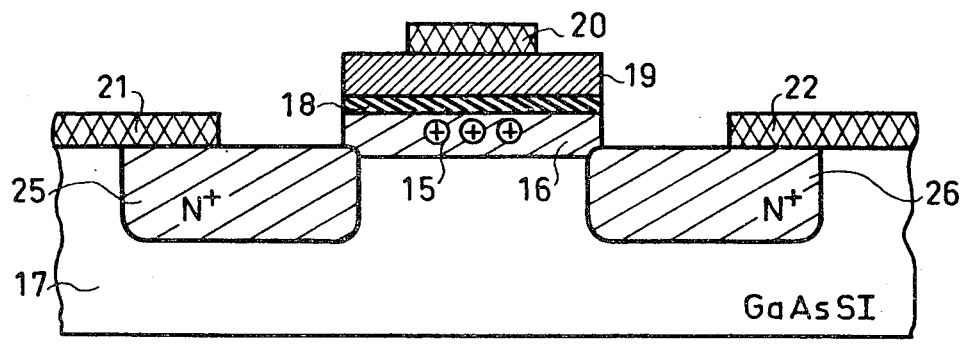
FIG. 11: a fourth type of non-volatile memory transistor according to the invention.

FIG. 11 shows a fourth example of a heterojunction MIS field effect transistor according to the invention, which constitutes a variant of the transistor of FIGS. 9 and 10. The difference relates to the grid metal coating 20, which does not completely cover the insulating layer 19. Thus, this structure makes it possible to reduce the grid length without it being necessary to reduce the equivalent length of the oxide, which is technically advantageous.

Another variant of the structures shown in FIGS. 9 and 10 involves using an active layer 16 doped to a level below $10^{14}$ at.cm$^3$ in place of the N-type conductive layer. In this case the transistors always function in a normally blocked state. The operating voltages of the grid are always positive with $V_1 < V_2$.

What is claimed is:

1. A field effect transistor with a non-volatile memory effect, comprising: supported by a semi-insulating substrate, two access regions called the source and the drain, respectively and a control region constituted by an active layer on said substrate and by a control grid on said active layer and itself formed by a semi-insulating layer in contact with the active layer and an insulating layer on said semi-insulating layer in contact with a control metallization, wherein the semi-insulating layer has a thickness below 100 angstroms so as to permit the passage of electrons by the tunnel effect and wherein it is made from a material from the group of III–V semiconductors having a broader forbidden band than that of the material forming the active layer and having a structure and crystalline parameters close to those of the material of said active layer.

2. A field effect transistor according to claim 1, wherein the active layer material is gallium arsenide, GaAs, the semi-insulating layer material is chosen from: $Ga_xIn_{1-x}P$, $Al_xIn_{1-x}P$, $AlP_xSb_{1-x}$, $Al_xGa_{1-x}As$, $Al_xGa_{1-x}P_ySb_{1-y}$, $Ga_xIn_{1-x}P_ySb_{1-y}$.

3. A field effect transistor according to claim 1, wherein as the active layer material is chosen from indium phosphide InP or $Ga_xIn_{1-x}As$, the semi-insulating layer material is chosen from among $AlAs_xSb_{1-x}$, $AlP_xSb_{1-x}$, $Al_xIn_{1-x}As$.

4. A field effect transistor according to claim 1, wherein the active layer undergoes N-type doping at $5.10^{16}$ to $10^{17}$ at.cm$^3$, has a thickness between 1000 and 2000 angstroms and extends under the source and drain regions.

5. A field effect transistor according to claim 1, wherein the active layer undergoes N-type doping at $5.10^{16}$ to $10^{17}$ at/cm$^3$, has a thickness below 1000 angstroms and is in contact with two boxes N+ doped to a level above $10^{18}$ at/cm$^3$ formed in the thickness of the substrate.

6. A field effect transistor according to claim 5, wherein the boxes are also in contact with the semi-insulating layer.

7. A field effect transistor according to claim 5, wherein the active layer projects with respect to the substrate, which it penetrates and is in contact with the boxes.

8. A field effect transistor according to claim 1, wherein the active layer is doped to a level below $10^{14}$ at/cm$^3$.

9. A field effect transistor according to claim 1, wherein the metallization of the grid partly covers the insulating layer.

* * * * *